United States Patent [19]

Howard

[11] Patent Number: 5,708,431

[45] Date of Patent: Jan. 13, 1998

[54] METHOD FOR COMPRESSION CODING OF POTENTIALLY UNBOUNDED INTEGERS

[75] Inventor: Paul Glor Howard, Morganville, N.J.

[73] Assignee: Lucent Technologies Inc., Murray Hill, N.J.

[21] Appl. No.: 557,636

[22] Filed: Nov. 14, 1995

[51] Int. Cl.⁶ .................................................. H03M 7/00
[52] U.S. Cl. ......................................... 341/107; 341/67
[58] Field of Search .................................. 341/50, 51, 67, 341/107, 63

[56] References Cited

U.S. PATENT DOCUMENTS

| | | | |
|---|---|---|---|
| 4,467,317 | 8/1984 | Langdon, Jr. et al. | 341/107 |
| 4,749,983 | 6/1988 | Langdon, Jr. | 340/347 |
| 4,870,695 | 9/1989 | Gonzales et al. | 382/56 |
| 5,227,788 | 7/1993 | Johnston et al. | 341/63 |
| 5,471,207 | 11/1995 | Zandi et al. | 341/107 |
| 5,592,162 | 1/1997 | Printz et al. | 341/107 |

OTHER PUBLICATIONS

P. G. Howard et al., "Arithmetic Coding for Data Compression", *Proc. of the IEEE 82*, Jun. 1994, vol. 82, No. 6 pp. 857–865.

JBIG, "Progressive Bi–level Image Compression", ISO/IEC International Standard 11544, ITU Intl Standard T.82, 1992.

P. Elias, "Universal Codeword Sets and Representations of the Integers", *IEEE Trans. Inform Theory*, vol. IT–21, No. 2, Mar. 1975, pp. 194–203.

*Primary Examiner*—Marc S. Hoff
*Attorney, Agent, or Firm*—Stephen M. Gurey

[57] ABSTRACT

An integer of potentially unbounded size is compression coded by first transforming the integer into a binary representation in which the length of the sequence of bits representing the integer is self-contained within the sequence itself. Each of the bits within the sequence is then coded with a binary arithmetic coder, such as the QM-Coder, which uses as a conditioning context for each bit, the bits of the sequence previously coded. In order to limit the amount of memory used to store the probability information associated with each conditioning context, memory is allocated for storing such information as that conditioning context is needed. Also, once a predetermined amount of memory has been used to store this probability information for different conditioning contexts, no further memory space is allocated for newly occurring conditioning contexts. Rather a special overflow memory space is allocated and used for all conditioning contexts not previously defined.

13 Claims, 2 Drawing Sheets

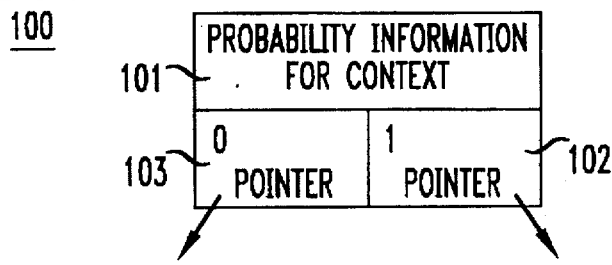
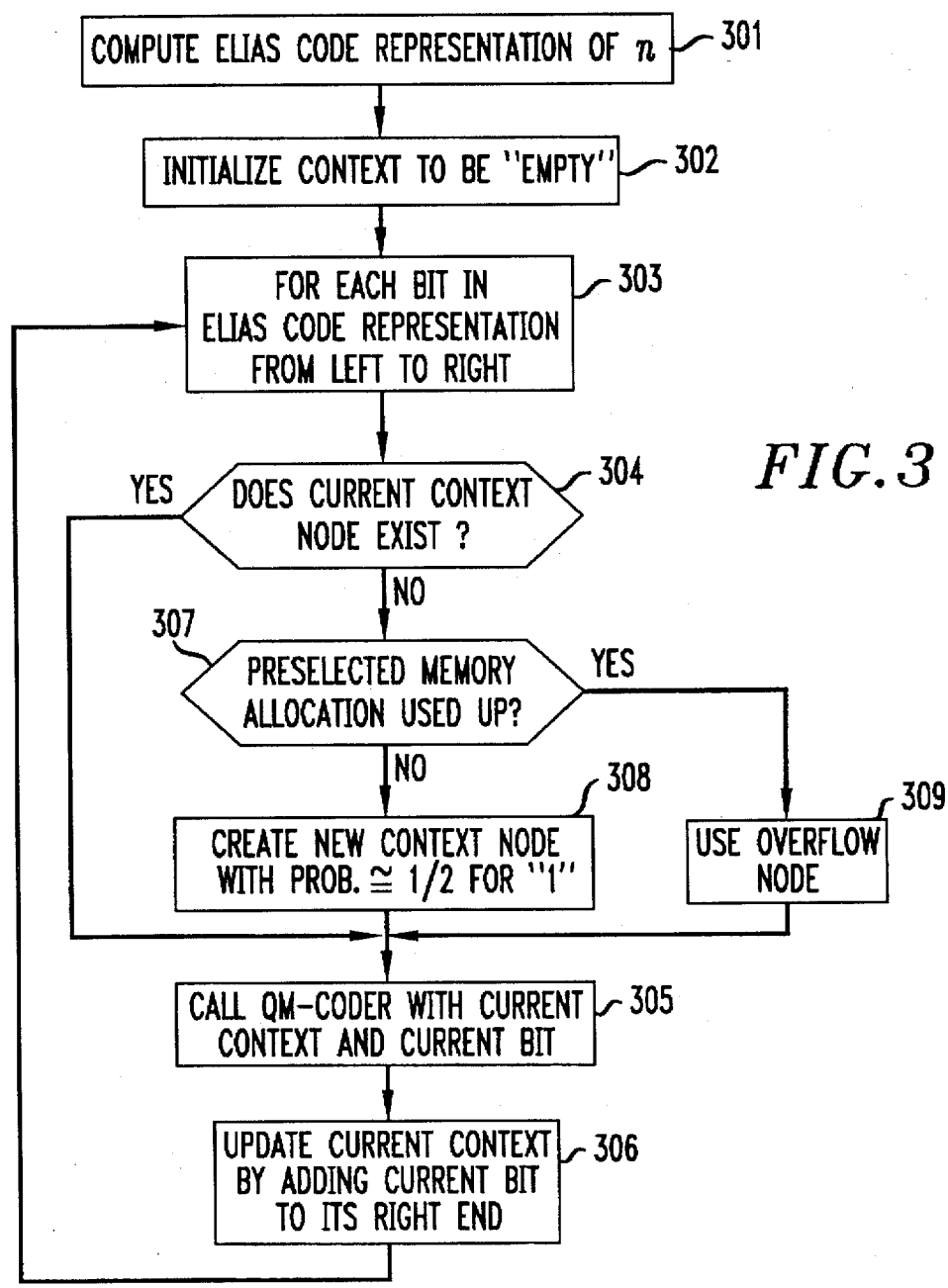

5,708,431

METHOD FOR COMPRESSION CODING OF POTENTIALLY UNBOUNDED INTEGERS

TECHNICAL FIELD

This invention relates to the compression coding of integers that may be of potentially unbounded value.

BACKGROUND OF THE INVENTION

Arithmetic coding (see, e.g., P. G. Howard & J. S. Vitter, "Arithmetic Coding for Data Compression," *Proc. of the IEEE'82*, June 1994, pp. 857–865) is known as a useful coding technique for data compression. Given input data and a probabilistic model of the data, arithmetic coding encodes and decodes the input essentially optimally with respect to the probabilistic model.

The use of arithmetic coding for an input that can take on only two symbols (a binary input) has found wide application and study. For example, the QM-Coder is a well known arithmetic coder for a binary input that is incorporated into various international standards such as the JBIG standard for bi-level image compression, and the JPEG standard for the compression of continuous tone still images (see, JBIG, "Progressive Bi-level Image Compression," ISO/IEC International Standard 11544, ITU International Standard T.82, 1993; JPEG, "Digital Compression and Coding of Continuous Tone Still Images—Requirements and Guidelines," ISO/IEC International Standard 10918-1, ITU International Standard T.81, 1993). The QM-Coder is an adaptive arithmetic coder, meaning that the probability estimates change during coding to adapt to the actual statistics of the data source.

If the input is not binary but there is a known limit to the number of possible input values (that is, the size of the input alphabet is bounded), there are arithmetic coding techniques for directly coding from the multisymbol alphabet, but these are complex to implement. Alternatively, when the alphabet size is bounded, each multisymbol decision can be mapped into a series of binary decisions and each binary decision coded using a binary arithmetic coder.

Problems arise when the input alphabet is unbounded. Compression coding an integer that can take on unbounded values is difficult since the integer can never be represented in binary fashion with a fixed number of bits since that fixed number of bits can only represent bounded integers. Thus, a straight-forward binary sequence representing a potentially unbounded integer has no definable sequence end since the number of bits required to represent that integer cannot be fixed. Furthermore, the memory space needed for processing the compression coding of an integer may be insufficient when that integer has no bound.

SUMMARY OF THE INVENTION

In accordance with the present invention, an integer of potentially unbounded size is compression coded by first transforming the integer into a binary representation in which the length of the sequence of bits representing the integer is self-contained within the sequence itself. The bits associated with each coded integer can thus be unambiguously identified. Each of the bits within this sequence representing the integer is then coded with a binary arithmetic coder, such as the QM-Coder, which uses as a conditioning context for each bit, the bits of the sequence previously coded. In order to limit the amount of memory used to store the probability information associated with each conditioning context, memory is allocated for storing such information only as that conditioning context is needed. Furthermore, once a predetermined amount of memory has been used to store the probability information for different conditioning contexts, no further memory space is allocated for newly occurring conditioning contexts. Rather a special overflow memory space is allocated and used for all conditioning contexts not previously defined.

BRIEF DESCRIPTION OF THE DRAWINGS

FIG. 1 shows an illustrative node representing a location in a memory storage device in which is stored probability information for the conditioning context associated with the node, and two pointers to the locations in memory of each of the next two possible nodes;

FIG. 3 is a flowchart showing the steps of the present invention for compression coding an unbounded integer.

DETAILED DESCRIPTION

Figure 2:
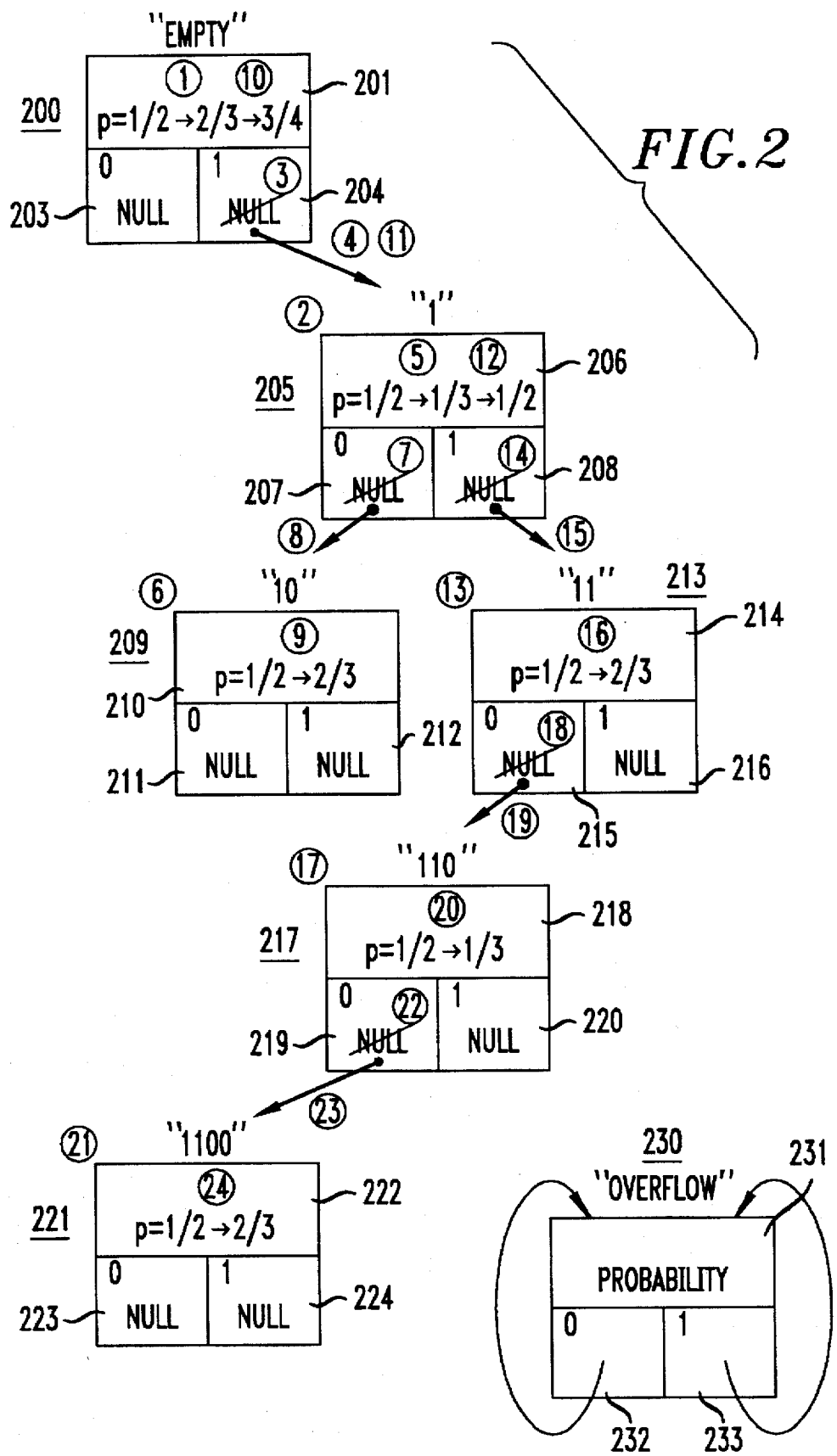
FIG. 2 shows the nodes created and their associated probability information used for compression coding an example of two successive integers of unbounded size.

When coding an integer n for transmission or storage that might, for example, represent the height in pixels of a small image, that integer can be readily represented by a sequence of bits. If the number to be transmitted or stored is known a priori to be less than some fixed value M, then n can be represented by a fixed number of bits, namely $\lceil \log_2 M \rceil$ bits. For example, if n is 22, it is represented as 10110 in binary and if M is 1024, n=22 is transmitted or stored by $\log_2 1024 = 10$ bits, namely 0000010110. If, however, there is no a priori bound M on the value of n, no fixed number of bits can be used to represent n and a receiver receiving a sequence has no way of determining where a word representing one integer ends and a word representing a next integer begins.

The so-called Elias code (see, P. Elias, "Universal Codeword Sets and Representations of Integers, "IEEE Trans. Inform. Theory IT-21, March 1975, pp. 194–203) is designed for encoding an arbitrary non-negative integer, n. In accordance with the Elias code, in coding a non-negative integer n, a number k=n+1 is first computed so that the most significant bit of the binary representation of k must be 1. Then a number a is computed, equal to the number of bits in the binary representation of k other than the most significant bit. The number a is then represented as a unary number, that is, a 1s followed by a single 0. This representation of a is then followed by the a bits of k other than the most significant bit. For the example if n=22, k=23, or 10111 in binary. The number k has 5 bits, so a=4, and a is represented in unary as four 1s followed by a 0, or 11110. Finally, the four bits of k other than the most significant bit, 0111, are appended to the unary representation of a. The bits used to represent n=22 are therefore 111100111, a total of 9 bits. The value of n can be recovered from a bitstream containing this sequence by reversing the process: a is determined by counting the number of 1s before the first 0 (a=4 in the example). The next a bits after the first 0 are then prepended with a 1, the most significant bit, giving k; k=10111 in the example. Since n=k−1, n=10110=22 in the example. As can be noted, the length of the sequence is readily determined by counting the number of 1s before the 0, doubling that number, and then adding one for the 0, to get the total number of bits in the codeword. The codeword itself thus contains sufficient information itself to represent its length.

Other solutions exist to the problem of encoding arbitrary integers that may require fewer bits. Many of these alternative methods have a two-phase structure: in the first phase, n is systematically tested to determine whether it falls into a succession of integer ranges until the range in which it does fall into is found, with a 1 being delivered each time a new range needs to be tried and a 0 being delivered when the correct range is found. In the second phase, a second sequence of bits is delivered to identify the exact value of n within the range. The Elias code, however, is particularly simple: the various first-phase ranges are based on the number of bits in n+1, and the second-phase refining sequence consists of the bits of n+1 other than the most significant bit.

In accordance with the present invention, the encoding of non-negative integers is combined with arithmetic coding to give a method for coding and compressing integers instead of just directly coding them. In particular, each output bit in the encoding of an integer is not considered just as a bit to be stored or transmitted but as an event that must be encoded. Thus, for the example of coding n=22 as the 9-bit sequence 111100111, each of the 9 event bits is encoded using an adaptive binary coder, such as the aforenoted QM-Coder. Since it is possible for an arithmetic coder to use less than one bit to encode a binary event, it is possible and indeed likely that the encoding of the total event stream will require fewer bits than the number of bits present in the event stream itself.

Each time the QM-Coder is called to code a bit in the event stream corresponding to the integer, it is supplied with probability information. Specifically, that information is the probability that a current bit to be coded is a 1 (or a 0). This probability information is usually conditioned on some context, which herein is the sequence of events already coded during the coding of the current integer. Table 1 shows the sequence of nine events to encoded in the coding of the sequence 111100111 representing the integer n=22, together with the conditioning context used for each event. For each number n that is encoded, the initial context that is used is the empty context (—), meaning no event in the sequence has been coded yet. This same empty context is used for the first bit for every sequence and is not conditioned on a previous bit.

Table 1

| Conditioning context | Output event | Remaining events |
|---|---|---|
| — | 1 | 11100111 |
| 1 | 1 | 1100111 |
| 11 | 1 | 100111 |
| 111 | 1 | 100111 |
| 1111 | 0 | 00111 |
| 11110 | 0 | 0111 |
| 111100 | 1 | 111 |
| 1111001 | 1 | 11 |
| 111110011 | 1 | — |

Arithmetic coding is usually used in an adaptive mode, meaning that the coder adapts to the statistics of the data being coded. When the binary arithmetic coder used to code each event is adaptive, as is the QM-Coder used in the embodiment of the present invention described herein, then the multisymbol coder in its totality is also adaptive. The probabilities for the binary contexts collectively represent the distribution of the integers being coded.

With reference to FIG. 1, the data associated with each context is stored in a memory location 100, referred to as a node, which contains three separately stored components. These components are the probability state information stored in location 101, which is used by the QM-Coder for the given context, and two pointers, stored in locations 102 and 103, which point to the memory locations of the contexts of other nodes. The context to which the right pointer points, stored in location 102, is formed by appending a 1 to the current node's context, and the context to which the left pointer points, stored in location 103, is formed by appending a 0 to the current node's context. The starting context is referred to as the root node and corresponds to the empty context. The context corresponding to a given node is not stored explicitly; instead it is implicit in the sequence of pointers followed to reach the node. The probability state information for a node represents the probability that the next bit in the sequence being coded is a 1, given the context (i.e., the sequence of bits) needed to get to that node. As the coder processes the bits in the sequence being coded, and as more sequences are coded, the probability state information for a given node is updated based on the actual values of next coded bits.

Using only finite memory resources, it is clear that a full node structure for an infinite set of possible symbols cannot be stored. Accordingly, and in accordance with the present invention, nodes are created in memory only when but not before they are first needed. Specifically, the memory structure initially consists of only the root node. When a decision is made that requires use of a node not yet created, that node is created. Both of its pointers are initially set to NULL, meaning that they do not point to a next node, and the probability state corresponds to the two events being approximately equally likely, but with low confidence. At any given time, therefore, the memory structure consists of only those nodes associated with contexts that have actually previously occurred.

The creation and use of the node structure to code integers is most easily understood with reference to specific numerical coding examples. For simplicity, the coding of the integers 2 and 4, in that order, as the first two integers being coded will be described in accordance with the coding method of the present invention. The node structure for these examples is shown in FIG. 2 and the explanation that follows refers to this figure. As previously described, each node stores a probability p, representing the estimated probability that the next bit is a 1, and two pointers that point to next nodes.

The first integer to be coded is 2. The Elias representation of 2 is first found, namely 101, using the aforedescribed procedures. Coding starts with a single node, the "empty" context node 200, with an estimated probability that the next bit in the context is a 1, p, being set and stored in location 201 at ½, and two NULL pointers for a next 0 and a next 1 being stored in locations 203 and 204, respectively. The first bit is a 1 so the QM-Coder is called with p=½. The QM-Coder codes the 1 and at step 1, indicated by the 1 in the circle within 201, increases the probability for this context from ½ to ⅔, reflecting the fact that the first bit was in fact a 1. It should be noted that this probability change and all the probabilities and their changes referred to in these examples are given for illustrative purposes only and are not the actual probability updates that the QM-Coder would actually perform. The next context should be "1", but that context has never occurred (known because of the NULL right pointer in location 204 in the "empty" context node 200). Thus, at step 2, a new node 205 is created for context "1". This involves setting p in location 206 to ½ and setting both the 0 and 1 pointers in locations 207 and 208, respectively, to NULL. At step 3, the NULL 1 pointer in location 204 in the "empty" context node 201 is removed and replaced at step 4 with a pointer to the newly created "1" context.

The next bit in the sequence to be coded is 0. The QM-Coder is called with p=½. The QM-Coder codes this 0 and at step 5, reduces the probability of a 1 in this context in location 205 from ½ to ⅓ since this occurrence indicated that a 0 was probably more likely than a 1. The next context should be "10", but that context has never occurred (known by the NULL 0 pointer in location 207 in the "1" context node 205). At step 6, therefore, a new node for context "10" is created. At step 7, the NULL 0 pointer in location 207 in the "1" context is removed and replaced, at step 8, with a pointer to the newly created "10" context node 209.

The final bit to be coded for n=2 is 1. The QM-Coder is called with p=½. The QM-Coder codes the 1 and at step 9, increases, in location 210, the probability of a 1 in this "10" context from ½ to ⅔ since a 1 was the actual bit coded. Since no more bits are to be coded, no additional contexts need be created and the pointers in locations 211 and 212 remain NULL.

The next integer to be coded is n=4. Its Elias representation is readily found, namely 11001. Starting at the "empty" context node 201 again, the first bit is a 1. The QM-Coder is called with the now stored probability of p=⅔. The QM-Coder codes this initial 1 and at step 10 increases the probability of 1 in this "empty" context node in location 202 from ⅔ to ¾. The next context is "1". Since this context was previously created when the integer 2 was coded, the previously set right pointer in location 204 is followed to that context in step 11. The next bit to be coded is 1. The QM-Coder is called with p=⅓, the latter being the value then stored in the probability location 206 of "1" context node 205. At step 12 that probability is increased to ½, reflecting the fact that a 1 was coded. The next context should be "11", but that context has never occurred (known because of the NULL right pointer in location 208). Thus, in step 13, a new node 213 is created for context "11", its probability in location 214 being set to ½ and the left and right pointers in locations 215 and 216 being NULL. At step 14 now, the NULL right pointer in location 208 of context node "1" is removed and, at step 15, is replaced with a pointer to the newly created "11" context node 213.

The next bit to be coded is 0. The QM-Coder is called with p=½. The QM-Coder codes this 0 and, at step 16, reduces the probability of a 1 in the "11" context node probability location 214 from ½ to ⅓; reflecting the fact that the bit just coded was a 0 instead of a 1. The next context should be "110", but that context has never occurred (known by the NULL in left pointer location 215 of "11" context node 213). At step 17 a new node location 217 is created for context "110", with p being set at ½ in probability location 218 and the left and right pointers in locations 219 and 220, respectively, being set at NULL. At step 18 the NULL left pointer in location 215 of "11" context node 213 is removed and replaced at step 19 with a pointer to the newly created "110" context node 217.

The next bit to be coded in the sequence of bits which comprise the code for n=4 is a 0. The QM-Coder is called with p=½ and, at step 20, the probability of a 1 in the probability location 218 of context "110" node 217 is reduced to ⅓ from ½, reflecting the fact that 0 that was just coded. The next context should be "1100", but that context has never occurred (known because of the NULL pointer in location 219 of "110" context node 217). At step 21 a new node 221 is created for context "1100", with p being set at ½ in probability location 222 and the left and right pointers in locations 223 and 224, respectively, being set at NULL. At step 22 the NULL left pointer in location 219 of "110" context node 217 is removed and replaced, at step 23, with a pointer to the newly created "1100" context node 221.

The final bit to be coded for n=4 is a 1. The QM-Coder is called with p=½. The QM-Coder codes the 1 and, at step 24, increases the probability in location 222 of node 221 from ½ to ⅔. Since this is the last bit to be coded, no more contexts need to be created until the next different integer is coded.

As can be seen, context nodes are created only as they are required for coding the successive bits within the Elias codeword representation of the integer being coded and compressed. For the example of n=22 shown in Table 1, it is obvious that eight layers of conditioning contexts below the "empty" context are required to code each of the bits in the sequence. If n=22 were the next integer to be coded after coding n=2 and n=4 in the example above, only the conditioning contexts "1" and "11" would already exist from these previous codings and the remaining conditioning contexts listed in Table 1 would each need to be created as each successive bit is coded.

Once a prespecified amount of memory has been used, indicating that memory usage in the memory storage device which stores the context information may be reaching its maximum capacity, no further new nodes are created. Rather a special overflow node is created, shown in FIG. 2 as node 230. The left and right pointers in locations 232 and 233, respectively, are fed back to this same node so that this same node is used for all subsequent contexts needed in the chain of contexts required for coding the integer presently being coded. The probability information stored in location 231 is continually updated in accordance with the statistics of the bits being coded using this context. Once the overflow node is created, it is thereafter used to provide a context during the bit-by-bit coding process of coding subsequent integers whenever a context node is called for which does not exist.

Negative integers can also be readily coded by first coding a decision as to whether n<0. If n<0, it is then converted to a positive integer between 0 and ∞, rather than a negative integer between −1 and −∞, by instead coding −n−1 using one structure of context nodes allocated for coding such negative integers. Otherwise, if n≥0, a separate structure of context nodes, as described hereinabove, is used.

FIG. 3 is a flowchart detailing the steps of the compression coding process of the present invention. At step 301 the Elias code representation of the non-negative integer n is computed. At step 302, having not yet seen any bits of the coded representation of n, the context is initialized at the "empty" context. For each bit in the Elias coded representation of n, from left to right (step 303), a determination is made whether a node exists for the current context (step 304). If a current context node does exist for the current context, then the QM-Coder is called at step 305 with the current context and the current bit. The QM-Coder encodes the current bit and then updates that same context's probabilities. The current context is then updated, at step 306, by adding the current bit to the right-end of the current context just used. Processing then returns to step 303 for the next bit in the Elias code representation of n, using the newly updated current context. If, at step 304, the current context does not exist, then a determination is made whether a preselected maximum amount of memory allocation has already been used for storing context nodes. If not, at step 308, a new context node for the current context is created with the probability being set at approximately ½ for a "1". Then, as before, in step 305 the QM-Coder is called with the current context and the current bit. If, at step 307, the preselected maximum memory allocation has been used, the overflow node is used at step 309. This overflow node is created when the preselected memory allocation is initially reached, and is used thereafter whenever a current context is called for that does not already exist.

A decoder using the present invention follows the same procedures described hereinabove for the coding process. These include determining contexts and locating the memory used for their probability information, passing probability information to and from the arithmetic decoder, allocating memory for probability information, and using a designated overflow location when necessary. In the decoder, the arithmetic decoder reads the bitstream and returns bits in the Elias representation of the integer, unlike the encoder where the Elias representation is given to the coder, and the bitstream is written. Also, the decoding of an integer ends based on information contained in the sequence of bits. Thus, the length of the sequence can be determined only by decoding some or all of the bits, whereas in the encoder the length of the sequence can be determined before coding commences. In the decoder, the sequence of bits is converted to an integer after decoding, which, of course, is opposite to the encoder where the integer is converted to a sequence of bits before coding.

Although described in conjunction with the use of Elias coding to represent the integer to be compression coded, other methods of encoding arbitrary integers could be equally used. Most methods proposed as run-length codes fall within this category, and most run-length codes can be converted to infinite structures capable of doing arithmetic coding for a multisymbol alphabet. As long as the binary representation of the integer to be compression coded self-contains the length of the sequence, the representation can then be coded using an arithmetic coder wherein the previous bits in the sequence are used as a context for the next bit. The Elias code is, however, advantageously simple in its implementation, although other methods may in fact result in faster coding.

Although the above-described embodiment uses all the previously coded bits in the codeword as a context for the current bit being coded, in some circumstances it may in fact be desirable to use only some of the previously coded bits as a context.

The above-described embodiment is illustrative of the principles of the present invention. Other embodiments could be devised by those skilled in the art without departing from the spirit and scope of the present invention.

The invention claimed is:

1. A method of compression coding an integer of potentially unbounded magnitude comprising the steps of:

transforming the integer of unbounded magnitude into a binary representation consisting of a sequence of bits in which the length of the sequence is self-contained within the sequence itself; and coding each bit of the sequence of bits with a binary arithmetic coder using previously coded bits of the sequence as a conditioning context.

2. The method of claim 1 wherein the binary arithmetic coder is adaptive to the binary values of the bits in the sequence, the method further comprising the step of updating probability information associated with each context after each bit is coded.

3. The method of claim 2 wherein the binary arithmetic coder is a QM-Coder.

4. The method of claim 1 further comprising the step of allocating memory in a storage device for storing probability information for a conditioning context as that conditioning context is required if that conditioning context has not previously occurred.

5. The method of claim 4 further comprising the step of using as a substitute conditioning context a designated overflow memory location in the storage device containing probability information for conditioning contexts when the total memory in the storage device previously allocated for storing probability information for conditioning contexts reaches a prespecified level.

6. The method of claim 1 wherein the integer is a non-negative integer.

7. The method of claim 1 wherein the step of transforming the integer into a binary sequence comprises the step of transforming the integer into an Elias code binary representation.

8. A method of compression coding a non-negative integer or a negative integer n of potentially unbounded value comprising the steps of:

if n is a negative integer, converting n to a non-negative integer transforming n if n is a non-negative integer, or transforming the converted n if n is a negative integer, into a binary representation consisting of a sequence of bits in which the length of the sequence is self-contained within the sequence itself;

coding the event of n being a non-negative integer or a negative integer with a binary arithmetic coder;

if n is a non-negative integer, coding each bit of its transformed sequence of bits with the binary arithmetic coder using previously coded bits of the sequence as a conditioning context, each conditioning context being associated with the coding of non-negative integers; and if n is a negative integer, coding each bit of its transformed converted sequence of bits with the binary arithmetic coder using previously coded bits of the sequence as a conditioning context, each conditioning context being associated with the coding of negative integers.

9. The method of claim of claim 8 wherein the step of transforming the non-negative integer n or the converted negative integer n into a binary sequence comprises the step of determining the Elias code binary representation of the non-negative integer n or the converted negative integer n.

10. The method of claim 8 wherein the binary arithmetic coder is adaptive to the binary values of the bits in the sequence, the method further comprising the step of updating probability information associated with each context after each bit is coded.

11. The method of claim 10 wherein the binary arithmetic coder is a QM-Coder.

12. The method of claim 8 further comprising the step of allocating memory in a storage device for storing probability information for a conditioning context as that conditioning context is required if that conditioning context has not previously occurred.

13. The method of claim 12 further comprising the step of using as a substitute conditioning context a designated overflow memory location in the storage device containing probability information for conditioning contexts when the memory in the storage device previously allocated for storing probability information for conditioning contexts reaches a prespecified level.

* * * * *